(12) United States Patent
Gao

(10) Patent No.: US 11,849,535 B2
(45) Date of Patent: Dec. 19, 2023

(54) DATA CENTER ARCHITECTURE WITH CONTAINED AISLE DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 124 days.

(21) Appl. No.: 17/390,099

(22) Filed: Jul. 30, 2021

(65) Prior Publication Data

US 2023/0033223 A1 Feb. 2, 2023

(51) Int. Cl.
*H05K 7/20* (2006.01)

(52) U.S. Cl.
CPC .......... *H05K 7/208* (2013.01); *H05K 7/203* (2013.01); *H05K 7/20318* (2013.01); *H05K 7/20327* (2013.01)

(58) Field of Classification Search
CPC .............. H05K 7/203; H05K 7/20781; H05K 7/20236; H05K 7/20318; H05K 7/2079; H05K 7/20; H05K 7/20654; H05K 7/1497; G06F 1/20; F28D 15/0266
USPC ....... 361/700, 699, 679.53, 724; 165/104.33, 165/80.4, 104.21, 80.2
See application file for complete search history.

(56) References Cited

U.S. PATENT DOCUMENTS

| | | | |
|---|---|---|---|
| 9,445,531 B1* | 9/2016 | Heydari | H05K 7/1497 |
| 2015/0060009 A1* | 3/2015 | Shelnutt | H05K 7/203 |
| | | | 165/11.1 |
| 2020/0344916 A1* | 10/2020 | Rancic | H05K 7/1497 |
| 2020/0384050 A1* | 12/2020 | Thornton | A61K 36/185 |
| 2021/0059079 A1* | 2/2021 | Keehn | H05K 7/20327 |
| 2021/0153392 A1* | 5/2021 | Gao | H05K 7/20818 |
| 2021/0219460 A1* | 7/2021 | Bailey | H05K 7/20754 |
| 2022/0167523 A1* | 5/2022 | Dumas | H05K 7/2079 |

* cited by examiner

*Primary Examiner* — Mandeep S Buttar
(74) *Attorney, Agent, or Firm* — WOMBLE BOND DICKINSON (US) LLP

(57) ABSTRACT

The disclosure provides a system, for designing and developing immersion cooling in data centers. The system includes multiple aisles that perform different functions. One of the aisles includes space for housing immersion tanks in which components of the data center may be positioned to be cooled. A second aisle allows the immersion tanks to be placed in the other aisle and for backside access. A third aisle transfers vapor from the aisle housing the immersion tanks to a vapor return unit to condense the vapor. A distribution unit distributes the coolant to cool the components of the data center is designed at the second aisle. The aisles and other units can be modularized to allow for deployment to meet different types of data center requirements.

19 Claims, 12 Drawing Sheets

DATA CENTER ARCHITECTURE WITH CONTAINED AISLE DESIGN

FIELD OF THE INVENTION

Embodiments of the present invention relate generally to data center cooling. More particularly, embodiments of the invention relate to multiphase cooling system arrangement.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
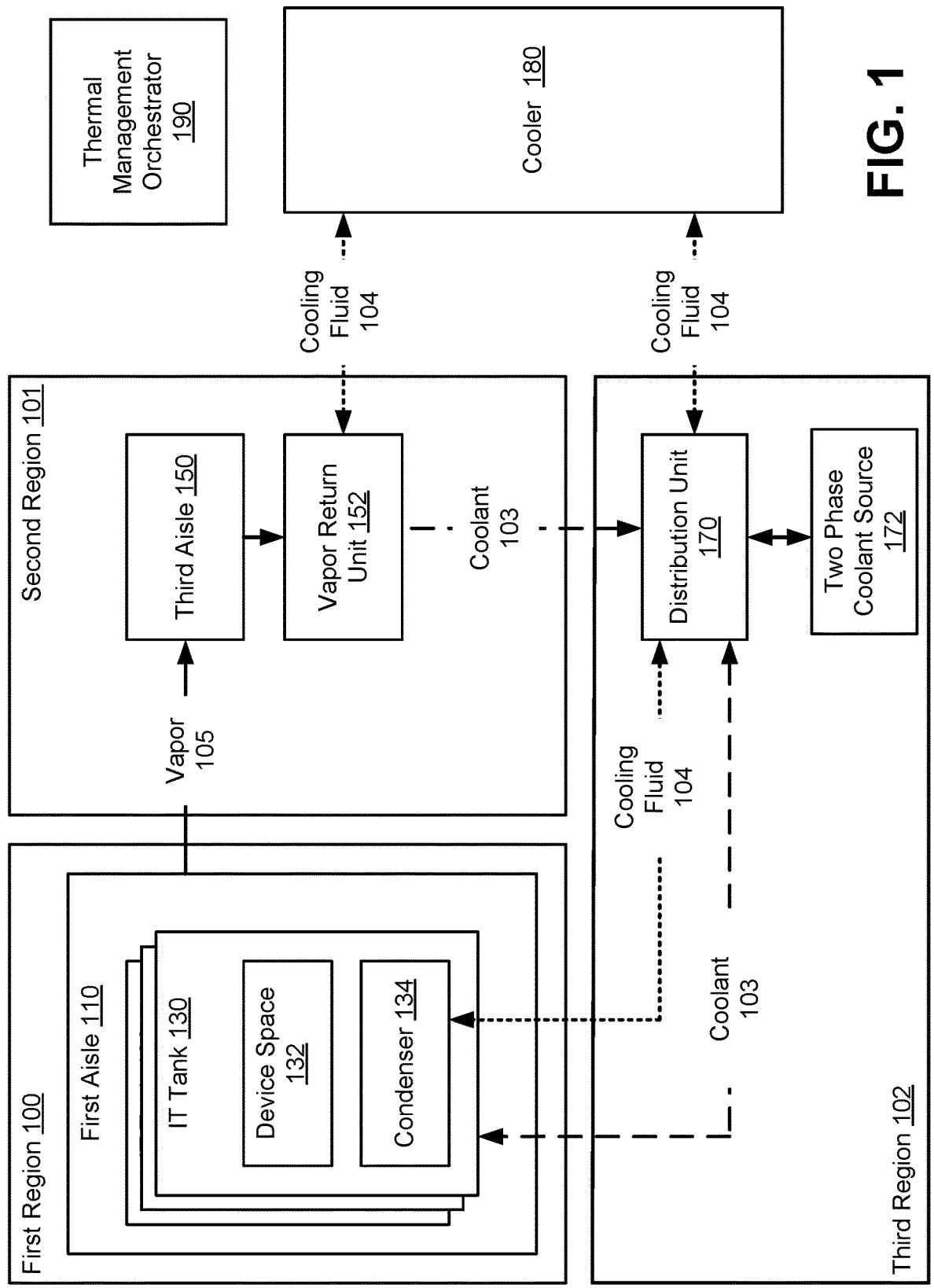
FIG. 1 is a block diagram illustrating a system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein relate to methods and systems for managing the thermal states (e.g., temperatures) of devices. The operation of the devices may depend on their thermal states. For example, elevated temperatures of devices may prevent successful operation of the devices, may decrease operating life of the devices, or may otherwise cause other undesirable outcomes.

A system in accordance with one embodiment manages the thermal states of devices using a coolant. The coolant may go through liquid to gas (e.g., vapor) and gas to liquid state changes while used to cool the devices.

By virtue of its gaseous state, the vapor may be subject to loss into an ambient environment (e.g., though imperfect seals, open lids, etc.). To prevent or limit loss of vapor into the ambient environment, in one embodiment, the cooling system includes multiples aisles and units arranged to prevent the loss of the vapor. For example, the aisles and units may include containments. The aisles and units may be arranged to reduce the possibility of the vapor leaving the containments. The arrangement may be a portion of a coolant management topology.

The cooling system may include a first aisle in which immersion tanks are positioned. The to-be-cooled devices may be positioned in the immersion tanks immersed (in part or completely) in liquid coolant. Heat from the devices may vaporize portions of the coolant resulting in vapor. Some of the vapor may flow out of the immersion tanks into the first aisle. For example, when operating the immersion tanks may be open and allow the vapor to flow out into the first aisle during regular operation. The first aisle may include information technology (IT) space in which the immersion tanks are positioned and access space for allowing a person to move along the first aisle and access the front side of the immersion tanks.

A second aisle may be positioned next to the first aisle to allow for the immersion tanks to be moved into and out of the first aisle, as well as to provide back side access to the immersion tanks (front side access may be provided with the first aisle).

A third aisle may be positioned above the first aisle and include openings to allow the vapor to rise from the first aisle into the third aisle. The third aisle may be connected to a vapor return unit. Through the connection, the vapor return unit may receive the vapor from the third aisle and condense it back into liquid coolant. Once condensed into liquid, the vapor return unit may provide the liquid coolant to a distribution unit which may distribute the liquid coolant to the immersion tanks.

In addition to distributing the liquid coolant to the immersion tanks, the distribution unit may also, in one embodiment, circulate cooling fluid to the immersion tanks, the vapor return unit, and/or a cooler for cooling the cooling fluid. In other embodiments, the distribution unit may only circulate coolant to the immersion tanks. The cooling fluid may be used to condense vapor 105 back into liquid coolant 103. For example, in one embodiment, the immersion tanks may also include condensers to which the cooling fluid is circulated. The condensers may generally condense vapor in the immersion tanks, while the vapor return unit (which may also include a secondary condenser unit) may condense vapor that flows out of the immersion tanks and into the first aisle. In contrast to the cooling fluid, the liquid coolant may be distributed into the interior of the immersion tanks where the devices are positioned to immerse the devices in the liquid coolant. While in other embodiments, cooling fluid may not be circulated to the immersion tanks, e.g., when the immersion tanks do not include condensers. In these other embodiments, only coolant 103 may be distributed to the immersion tanks to control a level of the coolant in the immersion tanks.

To provide for deployment and configuration of cooling systems, the aisles, vapor return unit, and distribution unit may be formed as modules. The modules may be able to be connected to each other (and/or other components) to form the cooling systems. The modules can be fully manufactured, assembled and tested before delivered to the deployment site to improve the deployment speed.

To provide for scaling of the cooling systems to meet IT system needs, the aisles may be arranged into repeating arrangements of rows. Each of the rows may include one of each of the aisles. A vapor return unit may service one, two, or multiple rows (e.g., the vapor return unit may receive vapor from multiple of the third aisle and return liquid coolant used in the rows to cool devices in immersion tanks). The vapor return unit, in combination with the serviced rows, may form a unit, which may be repeated (e.g., sequentially) any number of times to form a cooling system having a capacity that meets the requirements of an IT system.

A cooling system, as discussed above, in accordance with embodiments may reduce or prevent the loss of vapor 105 and provide for deployment and configuration of cooling systems to meet IT system needs. Consequently, the IT system may be less costly to operate, may be less likely to fail (e.g., due to lack of coolant), may reduce coolant pollution of the ambient environment surrounding the system, and/or may provide other benefits.

Further, the cooling system may (i) accommodate a wide variety of IT systems by allowing the cooling system to be scaled with repeated arrangements of rows, (ii) provide for at least a level of redundancy by allowing the system to provide for cooling when one of the cooling loops is inoperable or operating at a reduced capacity, (iii) be of high reliability, (iv) be of high efficiency by utilizing two phase cooling (which may be more efficient than cooling with only single phase cooling), (v) provide for containment of vapor thereby reducing potential environmental pollution and loss of coolant, (vi) be quickly deployed using modularized components and flexible to meet different deployment scenarios, (vii) be simple in installation and servicing, and (viii) be compatible with different types of IT systems and facilities.

FIG. 1 is a block diagram illustrating a system according to one embodiment. In FIG. 1 and the figures that follow, multiple flows of coolant, cooling fluid, and vapors are illustrated. These flow may be unidirectional (illustrated using lines that terminate in arrows on only one end) or bidirectional (illustrated using lines having both ends that terminate in arrows). In some figures, flows of coolant 103 are illustrated using long dashed lines and flows of cooling fluid 104 are illustrated using short dashing lines. These flows may be portions of a loop or a coolant management topology. The loop may be a single phase loop in which the state of the flowing material is maintained in a single state (e.g., a liquid state). In contrast, the coolant management topology may include various components in which coolant 103 transitions from liquid to gas (e.g., vapor 105) and transitions back from gas into liquid coolant 103. A cooler 180 may be connected with the vapor return unit 152 for cooling fluid 104 recirculation usable to condense vapor 105 into liquid coolant 103. The cooling fluid 104 may be used for cooling the vapor return unit 152 and/or may directly bypass to the distribution unit 170 within the vapor return unit 152.

Coolant 103 may be used as part of the coolant management topology. Coolant 103 may be adapted to (i) be placed in direct contact with devices without negatively impacting the devices and (ii) vaporize at a temperature that maintains the devices in desired thermal states (e.g., temperature ranges in which the devices are designed to operate) thereby forming vapor 105.

Cooling fluid 104 may be used as part of the loop. Cooling fluid 104 may not be adapted to be placed in direct contact with the devices or vaporize while in the loop. Rather, cooling fluid 104 may be adapted to stay in a liquid phase while the loop is operating.

Coolant 103 and cooling fluid 104 may include dissolved gasses, impurities, suspended materials, and/or be implemented using a mixtures of multiple materials without departing from embodiments disclosed herein.

Referring to FIG. 1, the system may facilitate thermal management of any number of devices (none, one, two, many, etc.). To facilitate thermal management of the devices, the system may utilize coolant 103 to cool the devices. The coolant 103 may be used to extract thermal loads from the devices to manage their respective thermal states by cooling them. When used to cool the devices, coolant 103 may undergo a liquid to vapor phase change, and the reverse. To transform the vapor back into liquid coolant, a vapor return unit 152 and/or condenser 134 may be used. A cooling fluid 104 may be circulated through these devices to condense vapor 105 back into coolant 103.

When the coolant is transformed into vapor 105, it may become more difficult to keep vapor 105 from being lost into the ambient environment. If vapor 105 escapes, then some of the coolant may be lost, the coolant may need to be replenished which increases the operating cost for cooling the devices, and/or the lost coolant may pollute or otherwise cause undesired impacts on the ambient environment proximate to the system.

To facilitate thermal management of the devices, the system includes, but is not limited to, three regions 100, 101, 102. Each of the regions may perform similar and/or different functions to thermally manage the devices.

In one embodiment, first region 100 provides thermal load transfer services to the devices. Thermal load transfer services may include one or more of (i) transferring thermal loads from the devices into coolant 103 in which the devices are at least partially immersed, (ii) capturing vapor 105 generated by virtue of the thermal loads transferred into coolant 103, (iii) transforming vapor 105 to coolant 103 by transferring the thermal loads from vapor 105 into cooling fluid 104, (iv) sending vapor 105 to second region 101 which may transform vapor 105 into coolant 103 with vapor return unit 152, (v) maintaining levels of coolant 103 in which the devices are immersed, and (vi) enabling physical access to the devices while limiting or preventing vapor 105 from escaping into the ambient environment. By doing so, first region 100 may facilitate thermal management of the devices in a manner that limits or prevents the loss of coolant 103 usable to transfer thermal loads from the devices.

The first region 100 may include, but is not limited to, first aisle 110 (e.g., an immersion tank aisle) and one or more IT tank 130. In one embodiment, IT tank 130 includes condenser 134. In another embodiment, IT tank 130 does not include a condenser.

IT tank 130 may be a physical device in which devices that will be thermally managed are positioned. IT tank 130 may be implemented using an immersion tank or other structure that includes device space 132 in which the devices may disposed. Device space 132 may be an interior region of IT tank 130 in which the to-be-cooled devices may be positioned and immersed, at least in part, in coolant 103.

The devices in IT tank 130 may include any type and quantity of devices. The devices may include computing devices that are part of a data center. The computing devices may provide any type and quantity of computer implemented services. While providing these services, the computing devices may generate heat that may need to be dissipated to manage the thermal states of the computing devices. The computing devices may include any number and type of hardware components that generate heat during operation including, but not limited to, processors, memory modules, storage devices, and communication devices.

When devices are disposed in device space 132 and immersed in coolant 103, thermal loads generated by the devices may be transferred into coolant 103. Transferring the thermal loads to coolant 103 may (i) manage the thermal states of the devices by maintaining the temperatures of the devices within a range and (ii) cause a portion of coolant 103 to undergo phase change from a liquid state to a gaseous state thereby generating vapor 105 (vapor is no longer a coolant).

In some embodiments, IT tank 130 includes condenser 134. Condenser 134 may condense vapor 105 inside of IT tank 130 into liquid coolant 103 using cooling fluid 104. For additional details regarding an IT tank that includes a condenser, refer to FIGS. 2B and 2C.

In other embodiments, IT tank 130 does not include condenser 134. Rather than condensing vapor inside of IT tank 130, all of the vapor 105 may flow out of IT tank during normal operation and may be condensed back into liquid coolant 103 elsewhere. For additional details regarding an IT tank that does not include a condenser, refer to FIG. 2D. Operation of IT tank 130 may include constantly resupplying coolant 103 to its interior.

In some embodiments, the IT tank 130 may generally be or may be sealable while operating. In such embodiments, the IT tank 130 may include condenser 134. In other embodiments the IT tank may generally be unsealed while operating to allow vapor 105 to flow out of the IT tanks.

While IT tank 130 is sealed (e.g., against gas exchange with the ambient environment), vapor 105 may generally be trapped within IT tank 130 (though some portion of the vapor 105 may escape out of IT tank 130). Condenser 134, disposed within IT tank 130, may transfer the thermal loads from vapor within IT tank 130 into cooling fluid 104 thereby causing vapor 105 inside of IT tank 130 to undergo a second phase change from the gaseous state back to the liquid state. In contrast, while IT tank is operated while unsealed (e.g., with an open lid), all of vapor 105 may flow out of the IT tank and toward third aisle 105, as shown in FIG. 1.

Cooling fluid 104 may be a part of a loop that transfers the thermal loads transferred into cooling fluid 104 to cooler 180. Cooler 180 may be part of the loop and may dissipate thermal loads transferred into cooling fluid 104 by condenser 134. Cooler 180 may also dissipate thermal loads from cooling fluid 104 used by vapor return unit 152 (discussed in greater detail below).

Condenser 134 may be implemented using, but not limited to, a heat exchanger and/or a condenser. Cooling fluid 104 may be circulated through condenser 134 to maintain its temperature (e.g., while exposed to vapor inside IT tank 130) within a range that causes thermal loads transferred into vapor 105 (in IT tank 130) to be deposited into or be otherwise transferred to cooling fluid 104. By doing so, vapor in IT tank 130 may condense into coolant 103 thereby replenishing coolant 103 used to cool devices in device space 132 (e.g., by maintaining the level of coolant 103 in which the devices are immersed in part and/or completely).

While IT tank 130 is not sealed (e.g., to enable a person to access a device disposed on IT tank 130), the vapor (all or a portion) may escape out of IT tank 130. If lost to an ambient environment outside, the performance of the system of FIG. 1 may be impaired (e.g., limits its ability to manage thermal loads of devices, increasing the operation cost of the system, etc.). For additional details regarding IT tank 130, refer to FIGS. 2A, 2B, 2C, and 2D.

To prevent or limit loss of vapor 105, any number of IT tank 130 may be positioned in first aisle 110. First aisle 110 may be implemented using a physical device (e.g., box, room, housing, etc.) that may generally allow for any number of IT tank 130 to be disposed within it.

First aisle 110 may (i) enable persons to physically access IT tank 130 and devices disposed therein, (ii) capture vapor 105 that escapes from IT tank 130 (and/or other types of devices disposed within first aisle 110), and (iii) transfer vapor 105 to vapor return unit 152 through third aisle 150. By doing so, loss of coolant 103 from the cooling system may be limited (e.g., in part or completely).

First aisle 110 may be pneumatically connected to vapor return unit 152 through third aisle 150. The pneumatic connection may enable vapor 105 from first aisle 110 to be transferred to vapor return unit 152 through third aisle 150. For additional details regarding first aisle 110, refer to FIGS. 3A-6B.

In one embodiment, second region 101 provides vapor management services. Vapor management services may include one or more of (i) transferring thermal loads from vapor 105 into cooling fluid 104 to condense vapor 105 into coolant 103, (ii) transferring cooling fluid 104 into which the thermal loads have been transferred to cooler 180, and (iii) transferring coolant 103 to distribution unit 170. By doing so, second region 101 may generate a liquid form of coolant 103 usable to manage the thermal states of devices by transforming vapor 105 escaped from any number of IT tanks into coolant 103. Thus, coolant 103 that has vaporized may be prevented from loss (in part or completely) from the system of FIG. 1 into the ambient environment (e.g., which may be a building or other environment in which computing devices may be housed).

To provide the vapor management services, second region 101 includes, but is not limited to, third aisle 150 and vapor return unit 152.

Third aisle 150 may be implemented using a physical device that may generally provide for transfer of vapor 105 from first aisle 110 to vapor return unit 152. For example, third aisle may be implemented with ducting or other structures for receiving the vapor from first aisle 110 and transferring it to vapor return unit 152.

Third aisle 150 may be pneumatically connected to first aisle 110 and vapor return unit 152. The pneumatic connection may enable vapor 105 from first aisle 110 to be transferred to vapor return unit 152 through third aisle 150. For additional details regarding third aisle 150, refer to FIGS. 3A-6B.

Vapor return unit 152 may process vapor 105 obtained from first aisle 110 and/or other devices (e.g., other aisles in with IT tanks may be positioned). Vapor return unit 152 may process vapor 105 by transferring thermal load entrained in vapor 105 to cooling fluid 104 to condense vapor 105 into coolant 103. The condensed coolant 103 may be transferred to distribution unit 170. Cooling fluid 104 to which the thermal loads have been transferred may be transferred to cooler 180 directly or via distribution unit 170 for heat dissipation purposes.

Vapor return unit 152 may be implemented using one or more physical devices such as, for example, condensers, and flow controllers (e.g., pumps).

In one embodiments, third region 102 provides coolant management services. Coolant management services may include one or more of (i) managing some of the flows (e.g., flow rates) of coolant 103 and cooling fluid 104 within the three regions (e.g., 100, 101, 102) to manage thermal loads and (ii) managing the levels of coolant 103 within IT tanks (e.g., removing it to enable persons to access devices disposed in IT tanks, to ensure that desired portions of devices are immersed in coolant 103, to maintain the temperatures of cooling fluid 104 and coolant 103, etc.). By doing so, third region 102 may improve the likelihood that devices disposed in IT tanks may be thermally managed using coolant.

To provide the coolant management services, third region 102 includes, but is not limited to, distribution unit 170 and coolant source 172. In one embodiment, coolant source 172 is located outside of third region 102.

Distribution unit 170 may participate in the operation of the loop and management of coolant levels in IT tanks. To do so, distribution unit 170 may (i) circulate cooling fluid 104 between condenser 134 and cooler 180, (ii) obtain liquid coolant 103 from vapor return unit 152 and/or coolant source 172, and (iii) add or remove coolant 103 to IT tanks (e.g., to maintain levels of coolant 103 in the IT tanks).

Distribution unit 170 may be implemented using any number of physical devices including, but not limited to, pipes for transferring the coolants and/or cooling fluids from place to place, manifolds for distributing the coolants, flow controllers (e.g., pumps, sensors, etc.) for managing the rate and direction of flows, sensors for identifying various levels of coolants at various locations within the system of FIG. 1, storage tanks for storing reserves of the coolant, etc.

Coolant source 172 may store coolant to supply coolant as necessary. Coolant source 172 may be implemented using a tank that includes some coolant (any quantity). Coolant source 172 may be coupled to distribution unit 170.

Cooler 180 may dissipate thermal loads in cooling fluid 104 into an ambient environment and/or may be a source of cooling fluid 104. By doing so, the thermal states of coolant 103 and/or cooling fluid 104 may be managed (e.g., kept within ranges). Cooler 180 may be implemented using any number and types of devices that perform any cooling method without departing from embodiments disclosed here. In an embodiment, the cooler 180 connects to vapor return unit 152.

Thermal management orchestrator 190 may manage the operation of any of the components of FIG. 1. To do so, thermal management orchestrator 190 may obtain information regarding the thermal states of the various devices and/or coolants (e.g., from any number of sensors) and use the obtained information to set flowrates of coolants within the system (e.g., by instructing flow controllers or other devices to set the flowrates to ranges based on the obtained information).

Additionally, thermal management orchestrator 190 may enable physical access to devices disposed in IT tanks by managing the level of coolant within the IT tanks. For example, when thermal management orchestrator 190 ascertains that a person desires to access a device in an IT tank, thermal management orchestrator 190 may decrease or otherwise modify a level of coolant within the IT tank in which the device is disposed. Once thermal management orchestrator 190 determines that access to the device is no longer desired, then thermal management orchestrator 190 may return the level of coolant within the IT tank to a different level used to maintain the thermal state of the devices disposed in the IT tank.

Thermal management orchestrator 190 may be implemented using a computing device. The computing devices may use a processor to execute computer instructions stored on a non-transitory computer readable medium that the processor to perform the functionality of the thermal management orchestrator discussed throughout this application.

To facilitate the rapid deployment and/or configurability of a cooling system, in one embodiment, regions 100, 101, 102 (and/or the aisles, units, devices disposed therein) are implemented as units, modules, or other types of physical structures that may be efficiently integrated with one another to form the system illustrated in FIG. 1 and/or larger, smaller, or different system that incorporate the system of FIG. 1. For example, any of regions 100, 101, 102 may be implemented as modules that are adapted to efficiently connect to one another to form the loop and/or coolant management topology used to thermally manage devices. The modules may include quick release fluid connectors and/or gaseous connectors disposed at corresponding locations on the modules to provide for efficient interconnection. For additional details regarding modules and the interactions between the regions 100, 101, 102, refer to FIGS. 3A-6B.

While illustrated in FIG. 1 as included a limited number of specific components, a system in accordance with one or more embodiments may include fewer, additional, and/or different components.

Figure 2A:
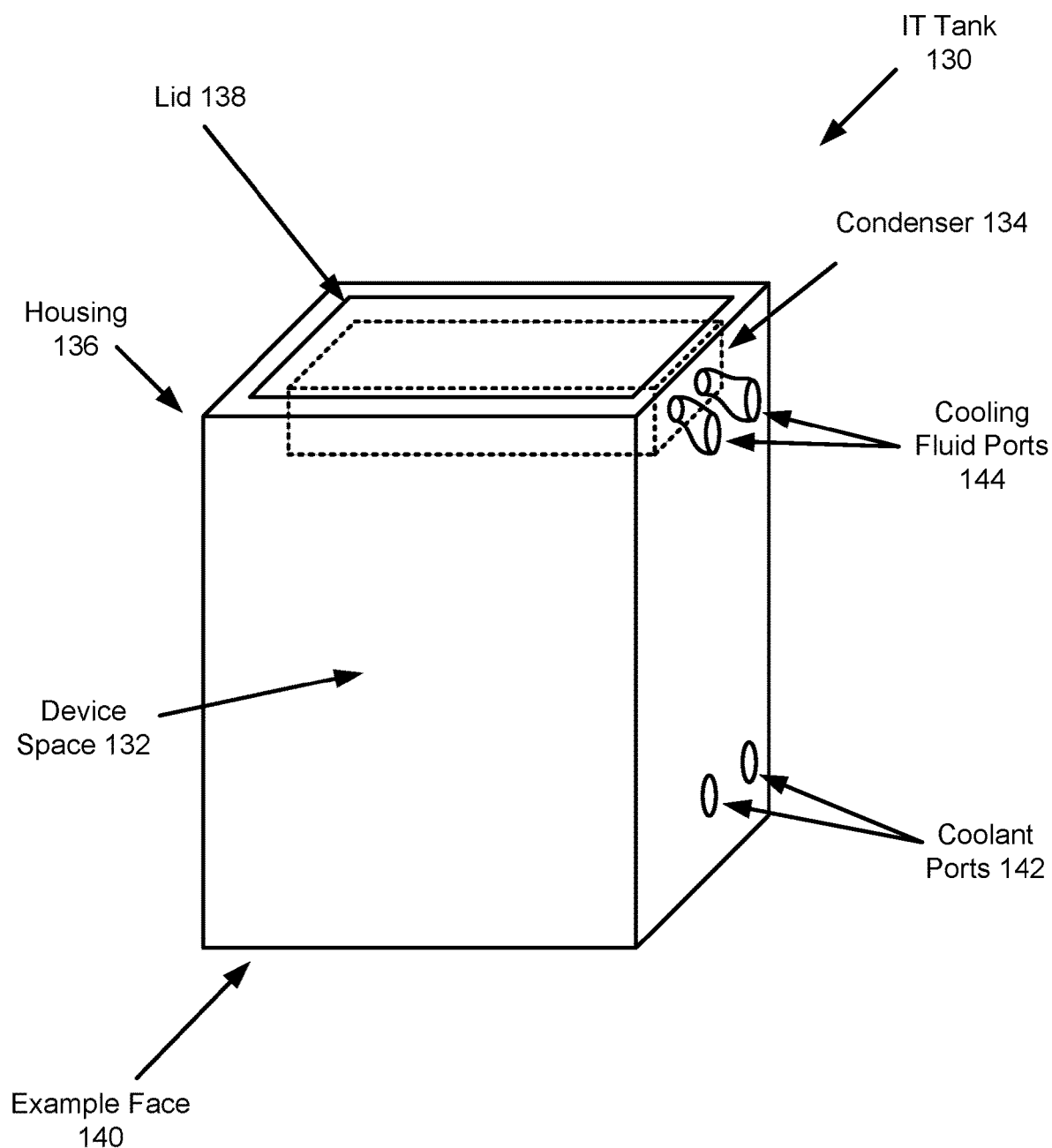
FIG. 2A is a diagram illustrating an information technology (IT) tank according to one embodiment.

FIG. 2A is a diagram illustrating IT tank 130 in accordance with one embodiment. IT tank 130 may include housing 136 which delineates an interior region in which device space 132 and condenser 134 (drawn in FIG. 2A in dashing to indicate that it is disposed within housing 136) are positioned. In some embodiments, condenser 134 is not present in IT tank 103.

Devices may be placed in device space 132 and may be immersed in coolant for thermal management purposes. Generally, if present, condenser 134 may be positioned towards an upper portion of the interior region (e.g., above device space 132) so that vapor in device space 132 is naturally directed toward condenser 134 via convection.

Lid 138 may be disposed on a side of the housing. Generally, housing 136 may be sealed (may not be perfectly sealed, some vapor may still escape while lid is closed) while lid 138 is closed and unsealed while lid 138 is open. When unsealed, vapor may escape into an ambient environment via lid 138. The lid shown in FIG. 2A is in the closed position. Once the lid is open for server operation or other purposes, only a portion of the vapor may be condensed by condenser 134. A majority of the vapor may escape from IT tank 130. In one embodiment, the IT tank 130 and system of which it is a part generally operates over the long term with lid 138 being open thereby generally allowing vapor to flow out of IT tank 130.

Coolant ports 142 may be disposed on housing 136. Coolant ports 142 may allow coolant to be added to and removed from the interior of housing 136 without allowing coolant and/or vapor from escaping through coolant ports 142. While illustrated as being on a side, coolant ports 142 may be located in other locations without departing from embodiments disclosed herein. For example, a first (e.g., a fill port) of the coolant ports may be disposed on a top of housing 136 while a second (e.g., a dump port out of which coolant is removed) of the coolant ports may be disposed on a lower portion of housing 136.

In one embodiment, cooling fluid ports 144 may be positioned on housing 136. Cooling fluid ports 144 may allow cooling fluid to be added to, removed from, and/or circulated through condenser 134 without allowing coolant and/or vapor from escaping through cooling fluid ports 144. Like coolant ports 142, cooling fluid ports 144 may be positioned at other locations without departing from embodiments disclosed herein. In one embodiment, IT tank 130 does not include cooling fluid ports 144 (e.g., when IT tank 130 does not include condenser 134).

Housing 136 may generally have a shape such as a rectangular box, cylindrical tube, or other shape that allows for IT tank 130 to provide its functionality. The shape may include any number of faces including example face 140. Housing 136 and the other components of IT tank 130 may be formed from any number of materials such as, for example, metals, plastics, rubbers, and/or other materials that enable IT tank 130 to provide its functionality.

While illustrated in FIG. 2A as included a limited number of specific components, an IT tank in accordance with one or more embodiments may include fewer, additional, and/or different components.

Figure 2B:
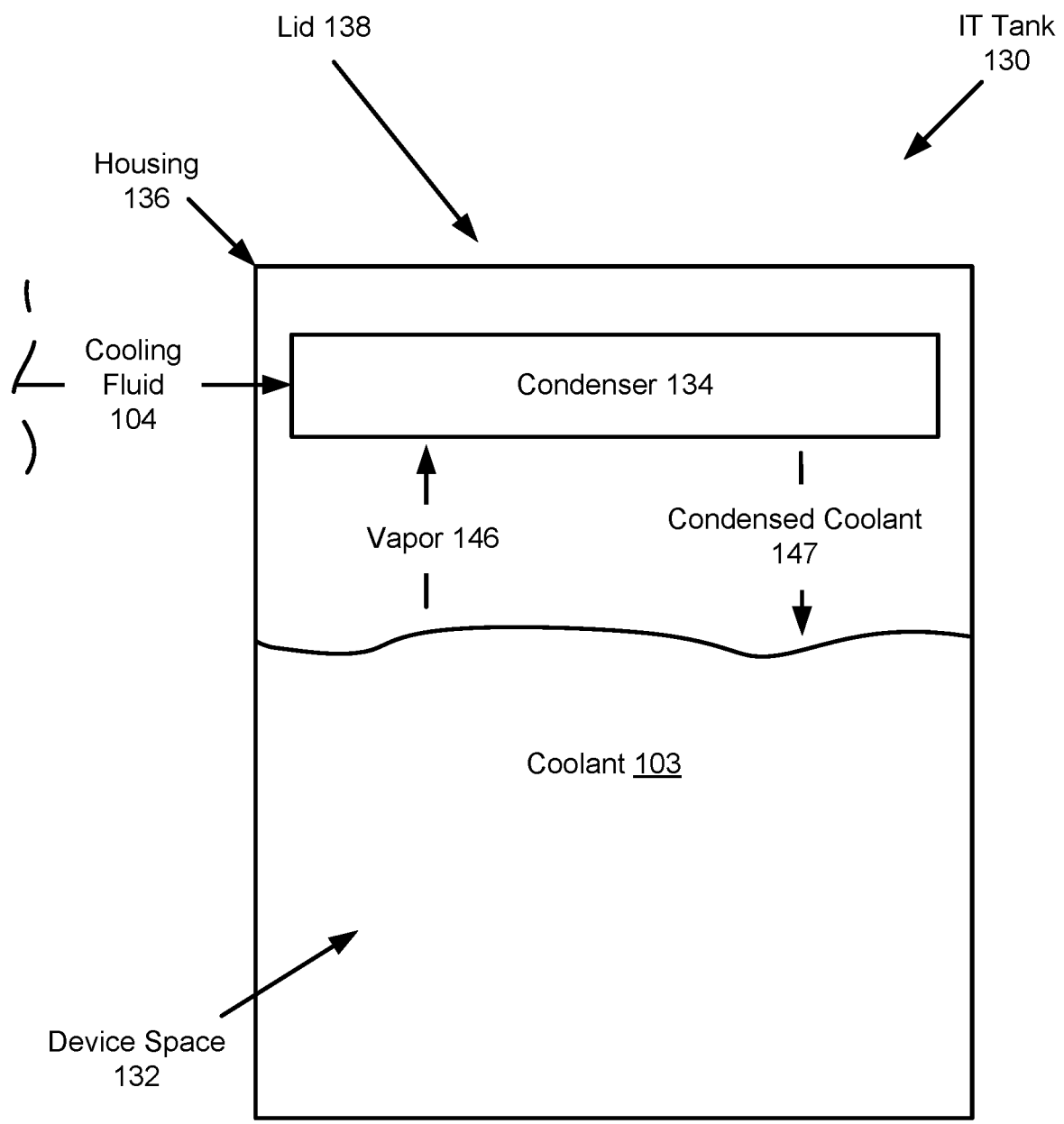
FIG. 2B is a first section diagram illustrating the IT tank according to one embodiment.

Turning to FIG. 2B, a first section diagram of IT tank in a sealed configuration in accordance with one embodiment looking toward example face 140 is shown. As seen in FIG. 2B, lid 138 is closed. While lid 138 is closed, thermal loads from devices (not shown) immersed in coolant 103 are transferred (e.g., via conduction, convection, etc.) to coolant 103 thereby maintaining the thermal states of the devices while the devices operate (e.g., perform functions that generate heat as a byproduct or direct result of the performed functions).

A portion of coolant 103 may vaporize due to the transferred thermal loads resulting in the generation of vapor 146. Because IT tank 130 is in a sealed configuration, vapor 146 may be trapped within IT tank 130. Condenser 134 may process vapor 146 to obtain condensed coolant 147 (e.g., liquid coolant), which may be returned to coolant 103.

Condenser 134 may condense vapor 146 using cooling fluid 104 (circulated through it) by transferring the thermal loads from vapor 146 into cooling fluid 104. By virtue of the circulation of cooling fluid 104 within condenser 134, the thermal loads transferred into cooling fluid 104 may be transferred out of IT tank 130 thereby thermally managing the components disposed in IT tank 130 by cooling them, including any devices immersed in coolant 103.

Figure 2C:
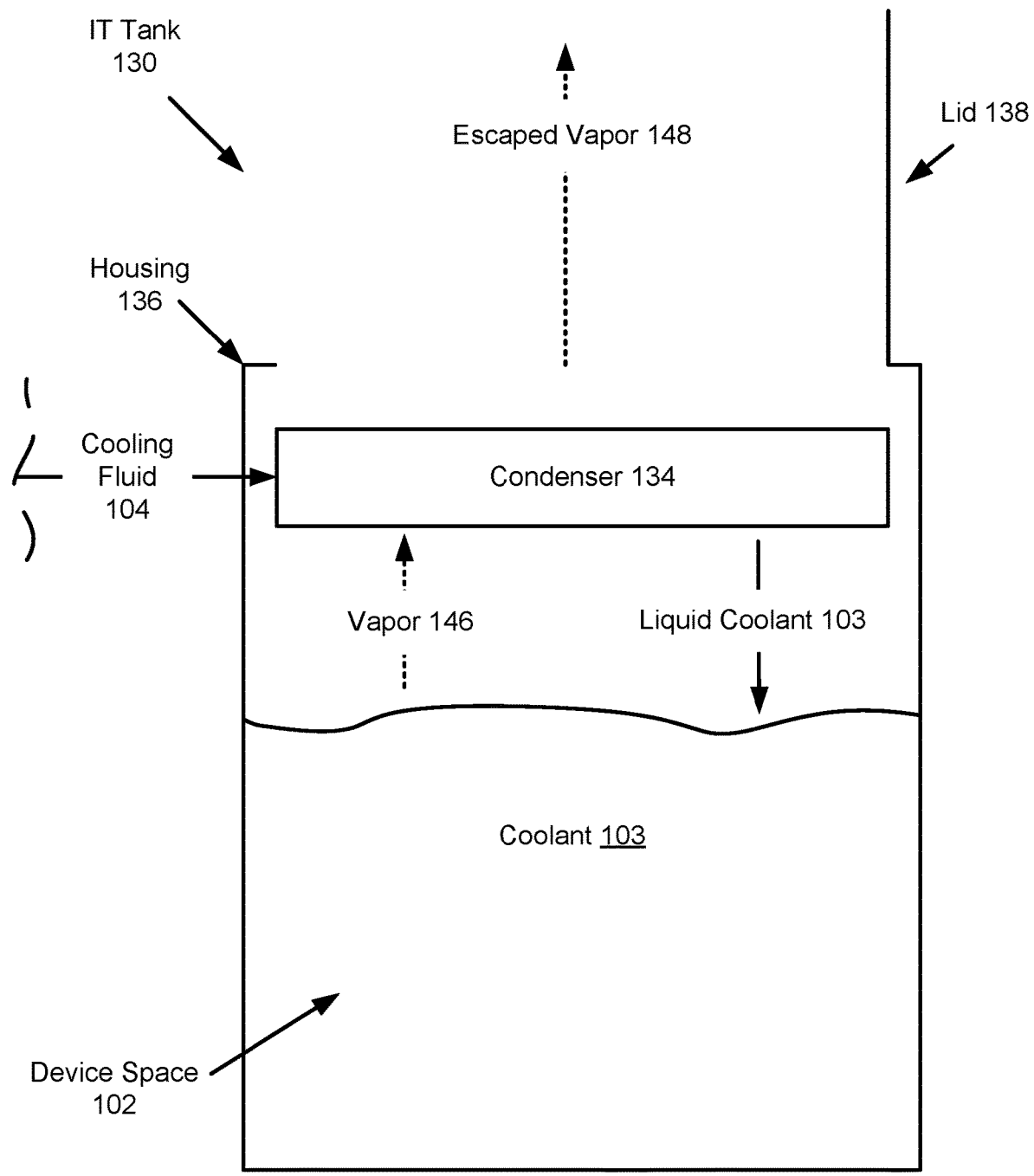
FIG. 2C is a second section diagram illustrating the IT tank according to one embodiment.

Turning to FIG. 2C, a second section diagram of IT tank 130 is shown in an unsealed configuration in accordance with one embodiment looking toward example face 140 of FIG. 2A. As seen in FIG. 2C, lid 138 is open. Lid 138 may be opened to, for example, physically access one or more devices disposed in the interior of housing 136. For example, if a device that is being thermally managed begins to malfunction, needs to be upgraded (e.g., add/remove hardware), or needs to be physically accessed for other reasons, lid 138 may need to be opened to enable physical access to the device. In some embodiments, lid 138 may generally remain open during operation of a system thereby allowing vapor to rise out of IT tank 130. In some embodiments, lid 138 may generally remain open during periods of time during which cooling fluid 104 is unavailable for circulation through condenser 134 or condenser 134 is inoperable for other reasons.

While lid 138 is open, thermal loads from devices (not shown) immersed in coolant 103 may be transferred (e.g., via conduction, convection, etc.) to coolant 103 thereby maintaining the thermal states of the devices while the devices operate (e.g., perform functions that generate heat as a byproduct or direct result of the performed functions).

A portion of coolant 103 may vaporize (or is already vaporized by virtue of previous operation of devices disposed in IT tank 130) due to the transferred thermal loads resulting in the generation and/or presence of vapor 146. Because IT tank 130 is in the unsealed configuration (or even while sealed but at a lesser rate), at least a portion of vapor 146 escapes out of IT tank 130 as escaped vapor 148 (even while condenser 134 operates, condenser 134 may not operate and/or be present in all embodiments disclosed herein). While lid 138 is open, vapor may continue to be generated and/or escape from lid 138.

As will be discussed in greater detail below, escaped vapor 148 may be captured thereby limiting and/or preventing loss of coolant.

Figure 2D:
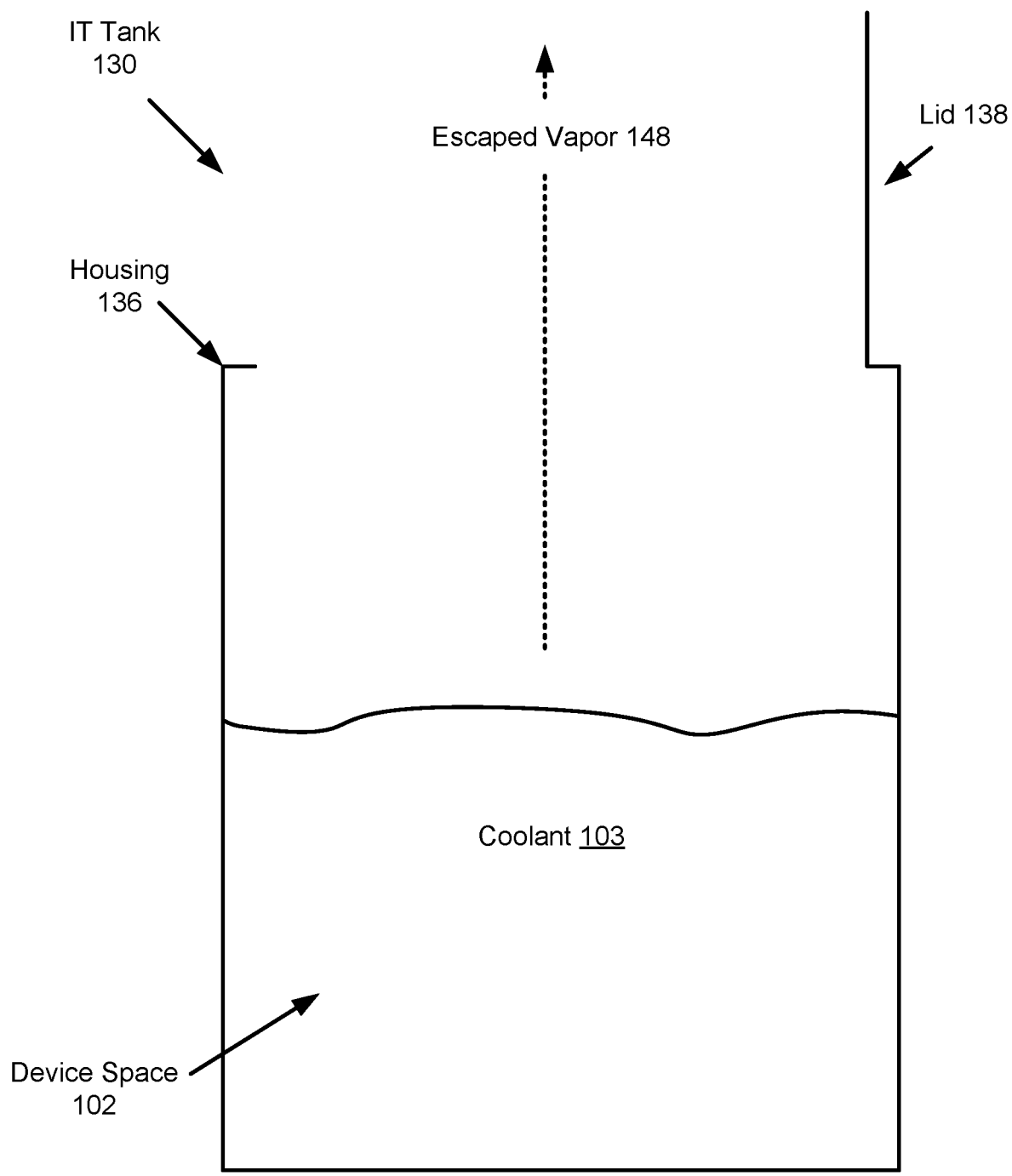
FIG. 2D is a third section diagram illustrating an IT tank according to one embodiment.

Turning to FIG. 2D, a third section diagram of IT tank 130 is shown in an unsealed configuration in accordance with one embodiment looking toward example face 140 of FIG. 2A. As seen in FIG. 2D, IT tank 130 does not include a condenser or cooling fluid ports. Lid 138 may generally be maintained as opened (while the system is operating) allowing for vapor to rise out of IT tank 130 as escaped vapor 148. In this example embodiment, coolant 103 may generally be replenished with liquid coolant from distribution unit 170. Coolant 103 may generally be delivered as necessary (e.g., constantly, intermittently, on-demand, etc.) to the IT tank 130 to maintain a level of coolant 130 in IT tank 130.

Figure 3A:
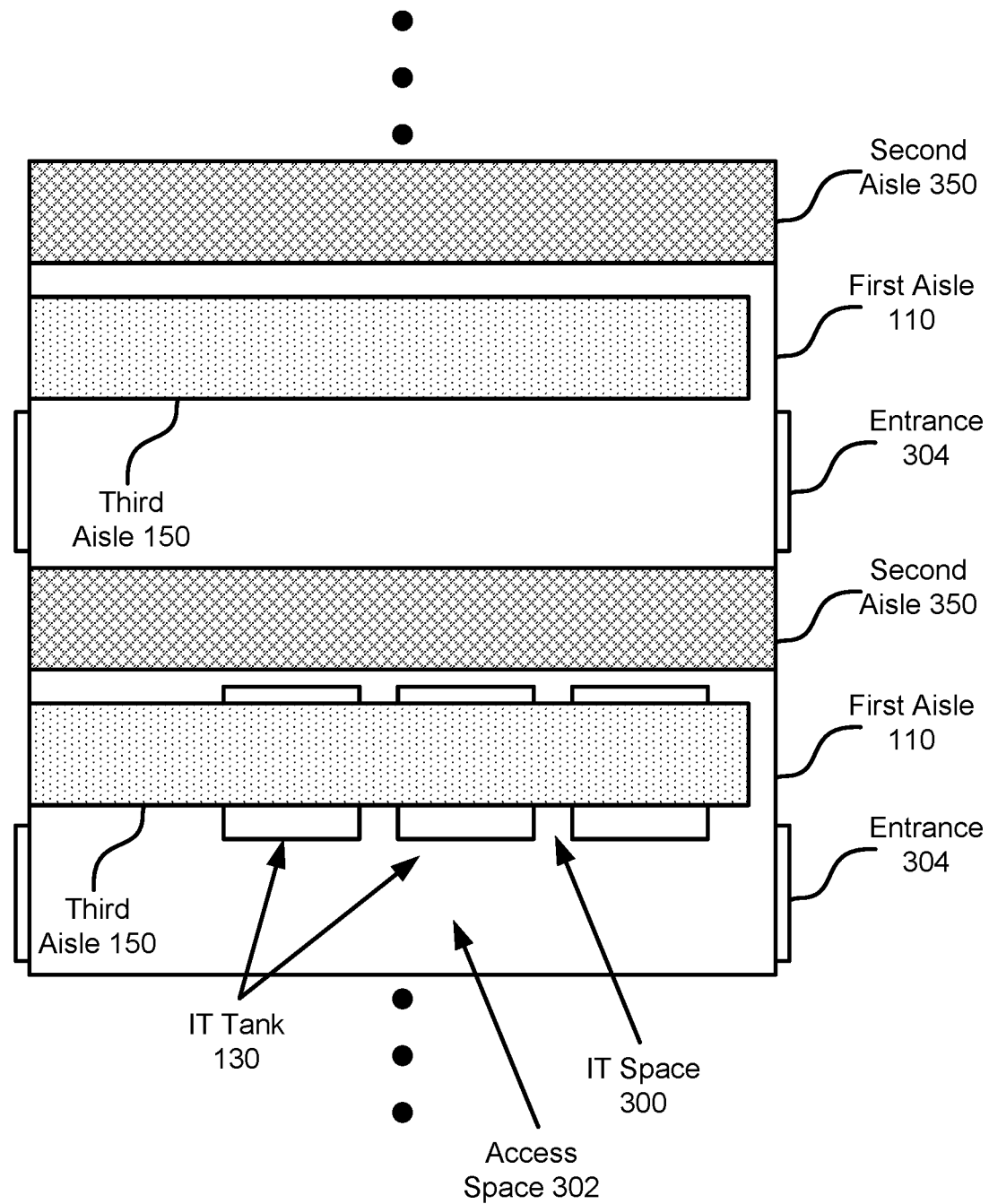
FIG. 3A is a top view diagram illustrating a cooling system including multiple aisles according to one embodiment.

Turning to FIG. 3A, a top view of a first topology of a cooling system in accordance with one or more embodiments is shown. The first topology may include any number of first aisle 110, second aisle 350 (e.g., a back side access aisle), and third aisle 150 (e.g., a vapor management aisle). For simplicity, a vapor return unit and only a limited number of IT tanks are shown in this figure (and subsequent figures). However, there may be IT tanks in any of the first aisles and a vapor return unit may also be present.

Each of these aisles may be arranged to provide for the formation of a loop and a coolant management topology to provide for cooling of devices positioned inside of IT tanks.

First aisle 110 may include IT space 300, access space 302, and entrance 304. IT space 300 may be a portion inside of first aisle 110 for housing IT tanks. In one embodiment, IT space 300 is entirely contained in first aisle 110.

Access space 302 may be a portion inside of first aisle 110, may be positioned next to IT space 300 in first aisle 110, and may allow for persons to move along the length of first aisle 110. Generally, IT space 300 and access space 302 may extend along the length of first aisle 110. Entrance 304 may be positioned at each (or one) of the ends of first aisle 110 to allow persons to enter and exit access space 302 from either end of first aisle 110. Entrance 304 may include a door or other structure for allowing persons to enter the interior of first aisle 110. The persons may, for example, access IT tanks and the devices contained within through access space 302.

Generally, first aisle 110 may be implemented as a containment such that vapor will not escape out of first aisle 110. First aisle 110 may generally be sealed, except for specific openings, entrances, and other features.

Second aisle 350 may be positioned next to a corresponding first aisle 110. Specifically, second aisle 350 may be positioned next to a corresponding first aisle 110 so that IT tanks may be placed in IT space 300 through second aisle 350. Generally, second aisle 350 may include a structure such as a hall running next to a length of first aisle 110. The hall may include doors or other structures through which the IT tanks may be moved into IT space 300 from second aisle 350. Thus, persons may access IT tank 130 from either side (i.e., from access space 302 or from second aisle 350) thereby allowing for both front side and backside access to IT tanks in first aisle 110.

Generally, second aisle 350 may be implemented as a containment or a non-containment. In other words, second aisle 350 may not generally be sealed from the ambient environment or it may generally be sealed.

Third aisle 150 may be usable to move vapor from first aisle 110 to a vapor return unit. Generally, third aisle 150 may be implemented as a vapor management channel. Third aisle 150 may include ducting or other structures (e.g., passive or active such as fans) to receive vapor along the length of first aisle 110 and provide the vapor to a vapor return unit. Third aisle 150 may be positioned above a portion of first aisle 110 (e.g., above IT space 300) and may include an opening or perforated panel or other structure through which vapor may rise into third aisle 150 from first aisle 110.

Generally, third aisle 150 may be implemented as a containment such that vapor will not escape out of third aisle 150. Third aisle 150 may generally be sealed except for its openings positioned to provide a flow of vapor from first aisle 110 to a predetermined location (e.g., a vapor return unit).

Figure 3B:
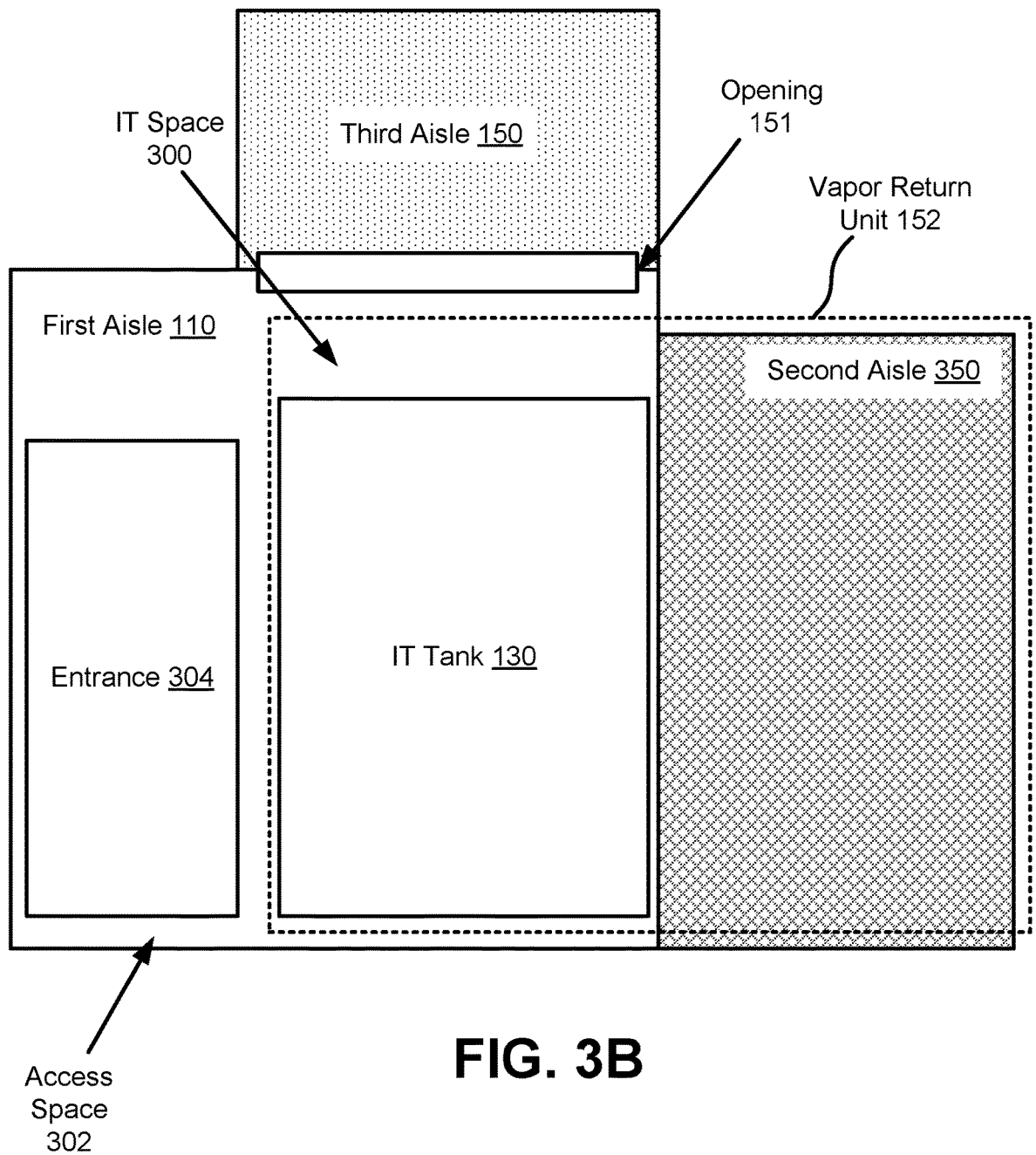
FIG. 3B is a side view diagram illustrating a cooling system according to one embodiment.

Turning to FIG. 3B, a side view (e.g., towards ends of the aisles) of a portion of the first topology of the cooling system shown in FIG. 3A in accordance with one or more embodiments is shown. In FIG. 3B, the view point is from the right hand side of the page of FIG. 3A looking towards the left hand side of the page.

Access space 302 may be positioned to one side of first aisle 110 and IT space 300 may be positioned to the other side of first aisle 110 so that persons are able to walk along the length of first aisle 110 (in the access space) thereby allowing for access (e.g., front side access) to any of IT tank 130 in first aisle 110. Second aisle 350 may be positioned next to IT space 300. Generally, IT tanks may be brought into second aisle 350, moved along the length of second aisle 350 until positioned next to where the IT tanks will be placed in IT space 300, and then may be moved to position the IT tanks in IT space 300 (e.g., through a door, opening, or other feature connecting second aisle 350 to first aisle 110). While not shown in FIG. 3B, doors or other structures may be positioned along the interface between first aisle 110 and second aisle 350.

As seen in FIG. 3B, third aisle 150 may be positioned above IT space 300. Any number of opening 151 may be positioned along the length of first aisle 110 and between first aisle 110 and third aisle 150. These openings may allow for the natural rise of vapor to flow from first aisle 110 into third aisle 150. The openings may be completely open or may just be perforated to allow vapor to flow between these aisles.

While third aisle 150 is illustrated as being separate from first aisle 110, third aisle 150 may be implemented as a part of first aisle 110 without departing from embodiments disclosed herein. For example, third aisle 150 may be implemented as a duct or other structure inside of first aisle 110 positioned towards a top of IT space 300.

Vapor return unit 152 (not shown in FIG. 3A) may receive vapor from third aisle 150 and condense it back into liquid coolant. Vapor return unit 152 may be positioned in numerous locations. In one embodiment, vapor return unit 152 is positioned at the end of first aisle 110 and second aisle 350. In that position, third aisle 150 may direct the vapor from first aisle 110 along its length to vapor return unit 152. In FIG. 3B, vapor return unit 152 is illustrated at the end of the lengths of first aisle 110 and second aisle 350. Vapor return unit 152 is illustrated using dashing to indicate that it is obscured from direct view by the aisles in FIG. 3B.

In one embodiment, vapor return unit 152 is positioned in second aisle 350. For example, vapor return unit 152 may be positioned within the second aisle 350.

Depending on the location, height, and/or other factors in implementing vapor return unit 152, connecting pieces or other structures between third aisle 150 and vapor return unit 152 may be used. Depending on numbers of aisles that a single vapor return unit serves and for redundant design purposes, the connecting pieces may be varied as well.

Generally, vapor return unit 152 may transform vapor back into liquid form. Once transformed into liquid, the liquid coolant may be directed to distribution unit 170. In at least one embodiment, distribution unit 170 is positioned in and/or above second aisle 350. Distribution unit 170 may extend along the length of second aisle 350. Liquid coolant may flow from second aisle 350 (or above it, wherever distribution unit 170 is positioned) into IT tank 130 in first aisle 110 resulting in the generation of vapor in first aisle 110. The vapor may rise into third aisle 150 where it is directed to vapor return unit 152. Vapor return unit 152 may condense the vapor back to liquid.

Figure 3C:
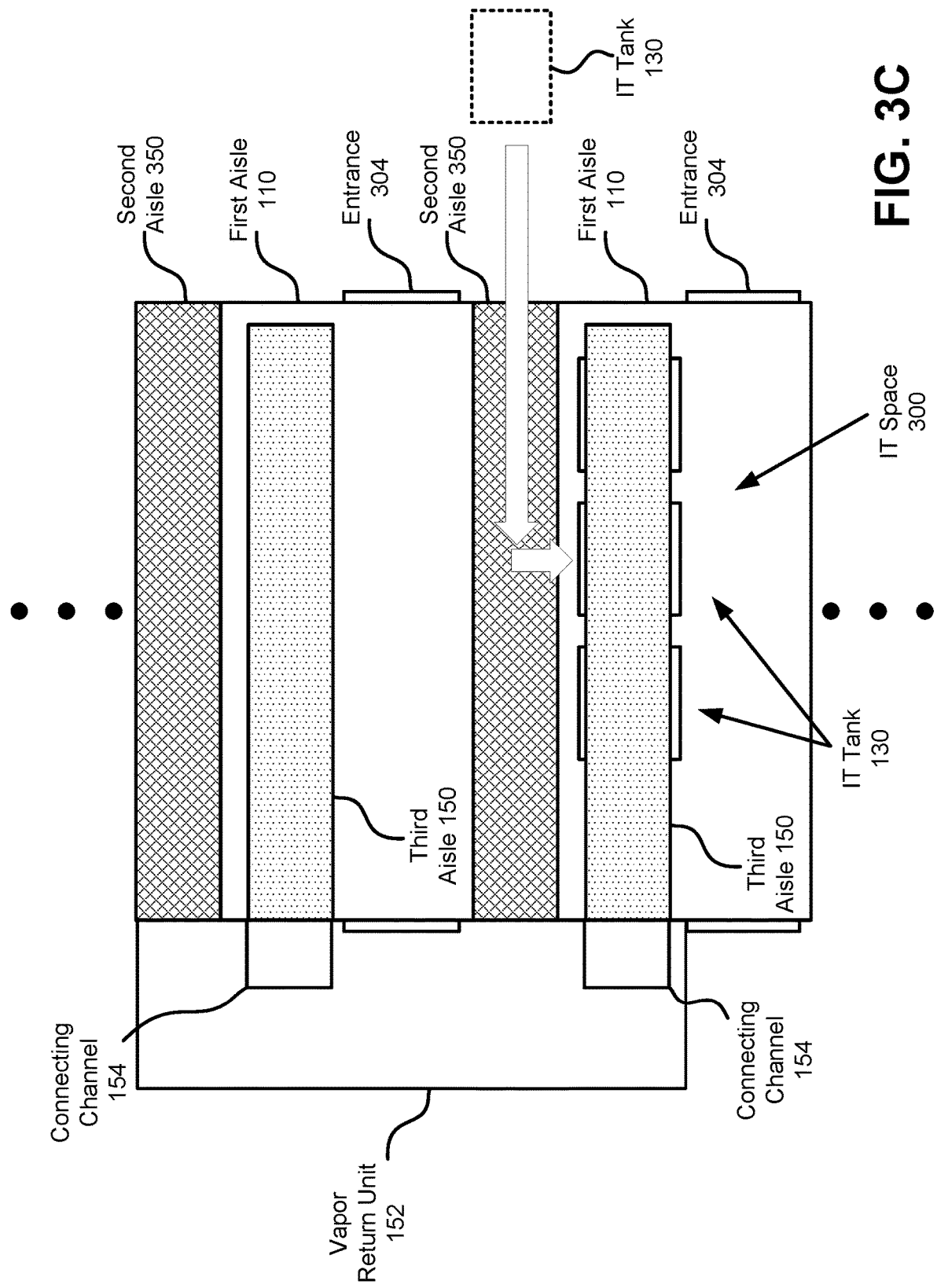
FIG. 3C is a top view diagram illustrating a cooling system including multiple aisles and a vapor return unit according to one embodiment.

Turning to FIG. 3C, another top view of the first topology of the cooling system shown in FIG. 3A in accordance with one or more embodiments is shown. As seen in this view, vapor return unit 152 is also shown as positioned at the end of the aisles.

Generally, vapor return unit 152 may receive vapor from one or of more third aisle 150, condense it into liquid, and provide the liquid coolant to one or more distribution units (which may be located in or by second aisle 350). Consequently, vapor return unit 152 may provide liquid coolant used by IT tanks in any number of aisles.

In one embodiment as shown in FIG. 3C, vapor return unit 152 is positioned at the end of the lengths of one or more aisles. To provide for pneumatic connection between vapor return unit 152 and one or more of the aisles, connecting channel 154 may be employed. Connecting channels 154 may include tubes, ducting, or other structures for directing the flow of vapor from third aisle 150 to vapor return unit 152. Connecting channels 154 may allow for vapor return unit 152 to be implemented in various manners such as having different shapes, being of different heights (e.g., from the third aisle 150), etc.

While vapor return unit 152 is shown in FIG. 3C as being at the end of one or more aisles, vapor return unit 152 may be positioned elsewhere.

To return liquid coolant to other devices, vapor return unit 152 may be connected to second aisle 350 (one or more of these aisles). The connection may be used to direct the liquid coolant to one or more distribution units (which may be positioned in second aisle 350 and/or other locations) and to facilitate circulation of cooling fluid through vapor return unit 152 with distribution unit 170. For additional details regarding the flow of cooling fluid and/or liquid coolant, refer to FIG. 4.

Additionally, as illustrated with oversized arrows in FIG. 3C, IT tanks may be moved into IT space 300 through second aisle 350. For example, the IT tanks may be positioned at an end of second aisle 350, moved into and along the length of second aisle 350 until appropriately positioned next to where the IT tanks will be placed in IT space 300, and moved into IT space 300 from second aisle 350. It is also shown in FIG. 3C that the IT tank 130 may be populated to the IT space 300 from the second aisle 350.

Figure 4:
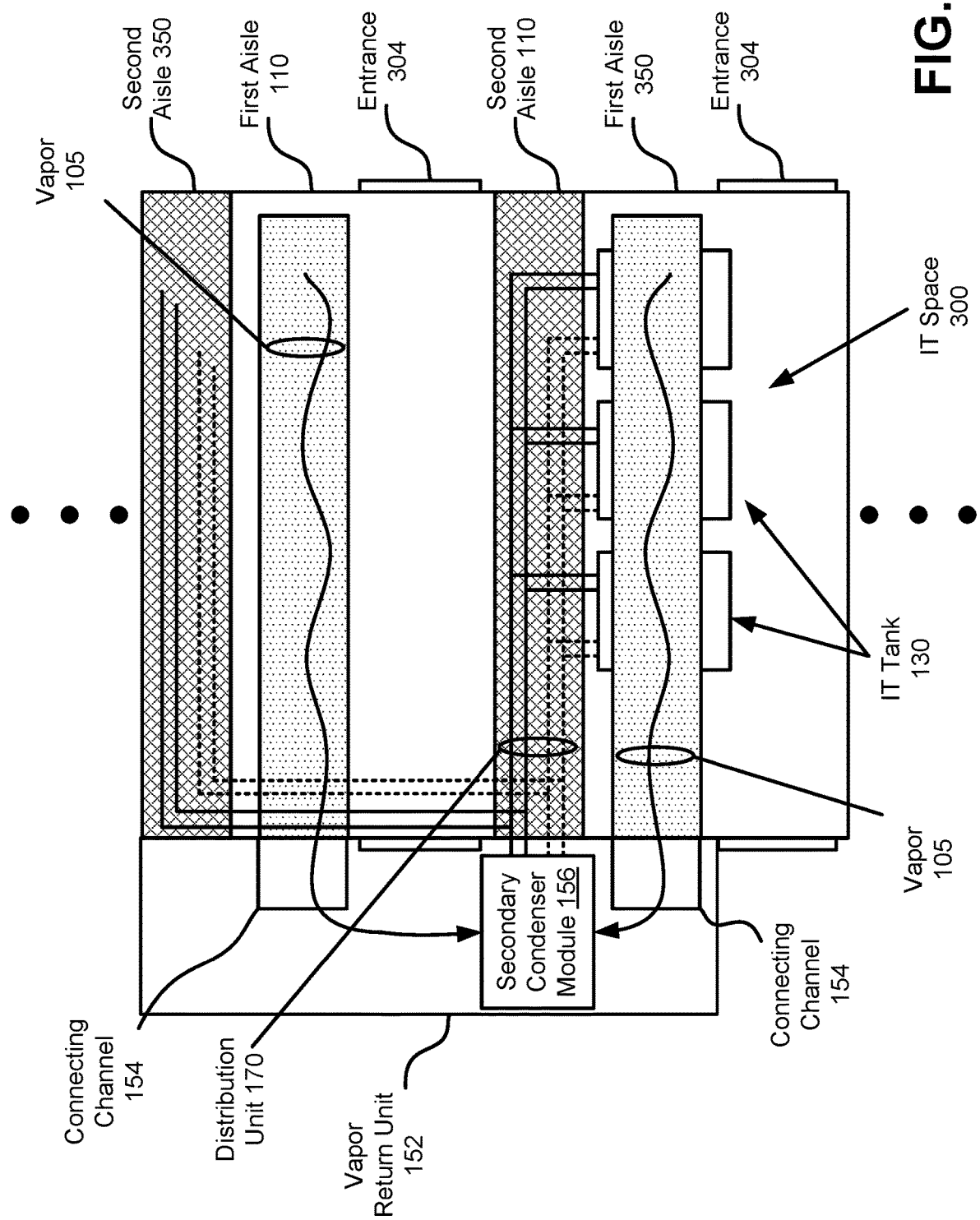
FIG. 4 is a top view diagram illustrating a cooling system including multiple aisles, a vapor return unit, and a distribution unit according to one embodiment.

Turning to FIG. 4, an additional top view of the first topology of the cooling system shown in FIG. 3A in accordance with one or more embodiments is shown. As seen in this view, distribution unit 170 is shown generally positioned in second aisle 350. While illustrated in FIG. 4 as being generally positioned in second aisle 350, various portions (or all) of distribution unit 170 may be positioned in different locations depending on how distribution unit 170 is implemented.

As discussed above, distribution unit 170 may include pipes, manifolds, and/or other components for controlling the distribution and circulation of cooling fluid and coolant. These components of distribution unit 170 may allow the cooling fluid and coolant to flow to the various components of the cooling system.

For example, some of distribution unit 170 drawn with dashing in FIG. 4 may be used to distribute coolant in the cooling system. Other portions of distribution unit 170 drawn with solid lines in FIG. 4 may be used to circulate cooling fluid in the cooling system.

To distribute the coolant, vapor 105 from multiple first aisles may rise into corresponding third aisles. The risen vapor 105 may move along the third aisles to vapor return unit 152. A secondary condenser module 156 may condense the vapor 105 back into liquid coolant. The liquid coolant may be provided to distribution unit 170 where it may be distributed back to the IT tanks. In at least one embodiment, the function of the vapor return unit 152 is integrated with the function of distribution unit 170 to form an integrated unit that provides both functions. In that scenario, the connecting channel 154 may direct the vapor 105 to the integrated unit, which may be positioned at different locations from where vapor return unit 152 and/or distribution unit 170 are illustrated as being positioned in FIG. 4.

Figure 5:
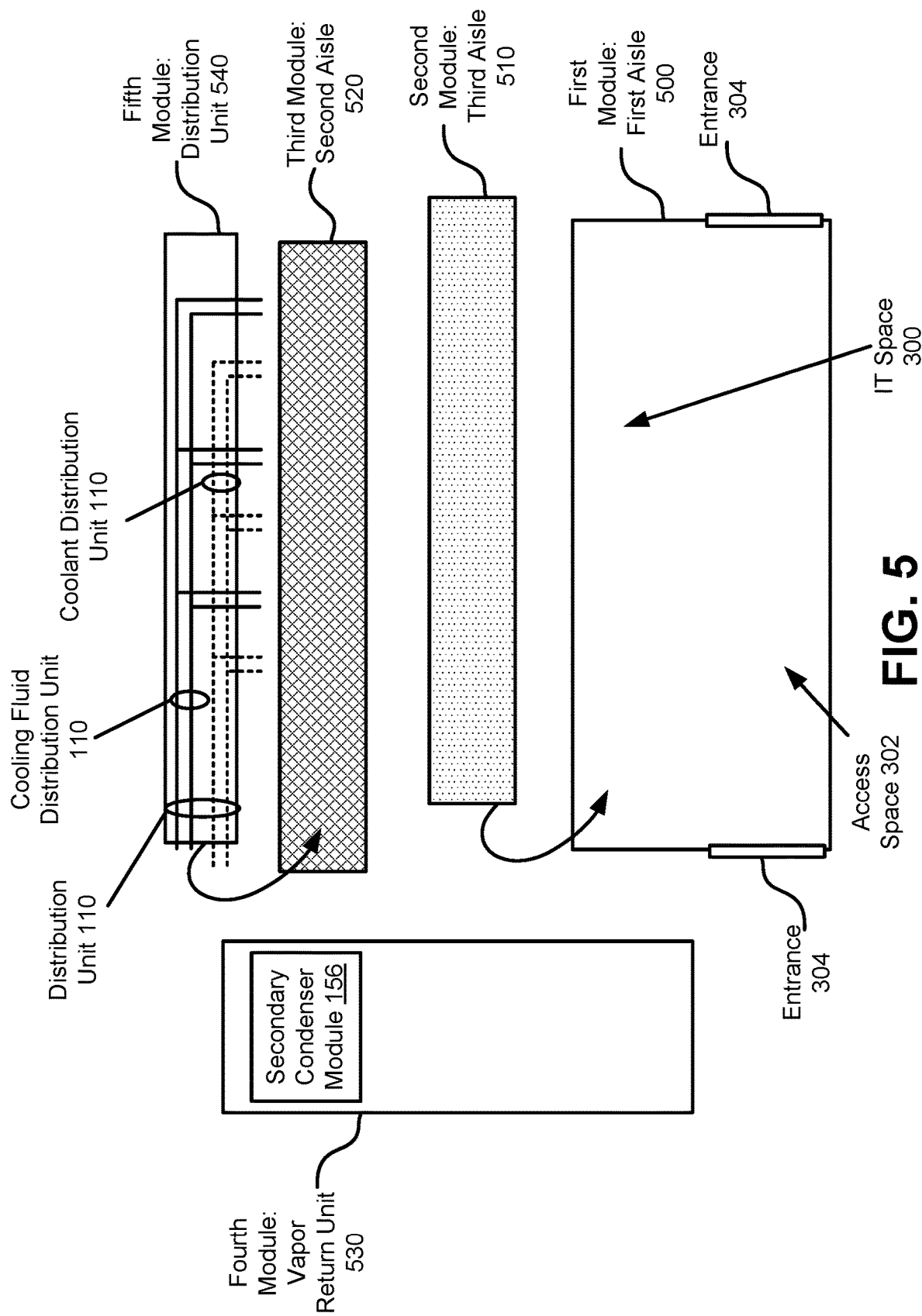
FIG. 5 is block diagram illustrating a modularized cooling system according to one embodiment.

To facilitate deployment of cooling systems, the various components of the cooling system may be formed into modules. A module may be a self-contained unit that may be rapidly deployed and integrated with other modules to form a cooling system. Turning to FIG. 5, a topology of a modularized cooling system in accordance with one embodiment is shown. The modularized cooling system may include five modules.

The first module 500 may provide the function of first aisle 110, discussed above. First module 500 may include the first aisle 110, including entrances, space for immersion tanks, space for allowing access to the immersion tanks, doors or other features to allow immersion tanks to be moved into the first aisle 110 from other aisles, openings to allow vapor to rise out first aisle 110 and into other modules, etc.

The second module 510 may provide the function of third aisle 150, discussed above. Second module 510 may include the third aisle 150, including openings to allow vapor to rise into it from other modules (e.g., the first module 500), openings to allow the vapor to flow out of it and into other modules (e.g., third module 530), etc.

In one embodiment, the openings of first module 500 out of which the vapor flows are positioned, have sizes, and/or are otherwise co-designed with the openings in second module 510 into which the vapor flows. For example, these modules may include structural features usable to align the respective openings with respect to one another, the openings may have sizes, shapes, and/or other physical features that are complementary to one another, etc.

The third module 520 may provide the function of a second aisle (e.g., 350), discussed above, including implementing IT. Third module 520 may include, for example, doors, openings, and other features to allow IT tanks to be brought into the module and moved out of the module into other modules (e.g., first module 500 to position the IT tanks in its IT space), etc.

In one embodiment, the third module 530 also provides or otherwise enables implementation of the function of distribution unit 170. For example, fifth module 540 may be positioned in third module 520, fifth module 540 may be positioned on top of third module 520, third module 520 and fifth module 540 may be implemented as a combined or unitary module, etc.

The fourth module 530 may provide the function of a vapor return unit (e.g., 152), discussed above. Fourth module 530 may include, for example, connections (e.g., 154) through which vapor may flow into the module (e.g., from second module 510), fluid connections through which cooling fluid may flow (e.g., from fifth module 540 and/or a cooler or other source of cooling fluid), fluid connections out of which liquid coolant may flow (e.g., to fifth module 540), a secondary condenser module (e.g., 156), etc.

The fifth module 540 may provide the function of a distribution unit (e.g., 170), discussed above. Fifth module 540 may include, for example, tubes, manifolds, and/or other flow control elements usable to control the flow of cooling fluid and coolant to and from other modules (e.g., to IT tanks in first module 500, to secondary condenser module 156 in third module 520, to cooler 180), etc.

In one embodiment, fifth module 540 is positioned inside of, attached to, or is a part of third module 520. In this manner, the functionality of both modules may be provided with a single, combined module.

Figure 6A:
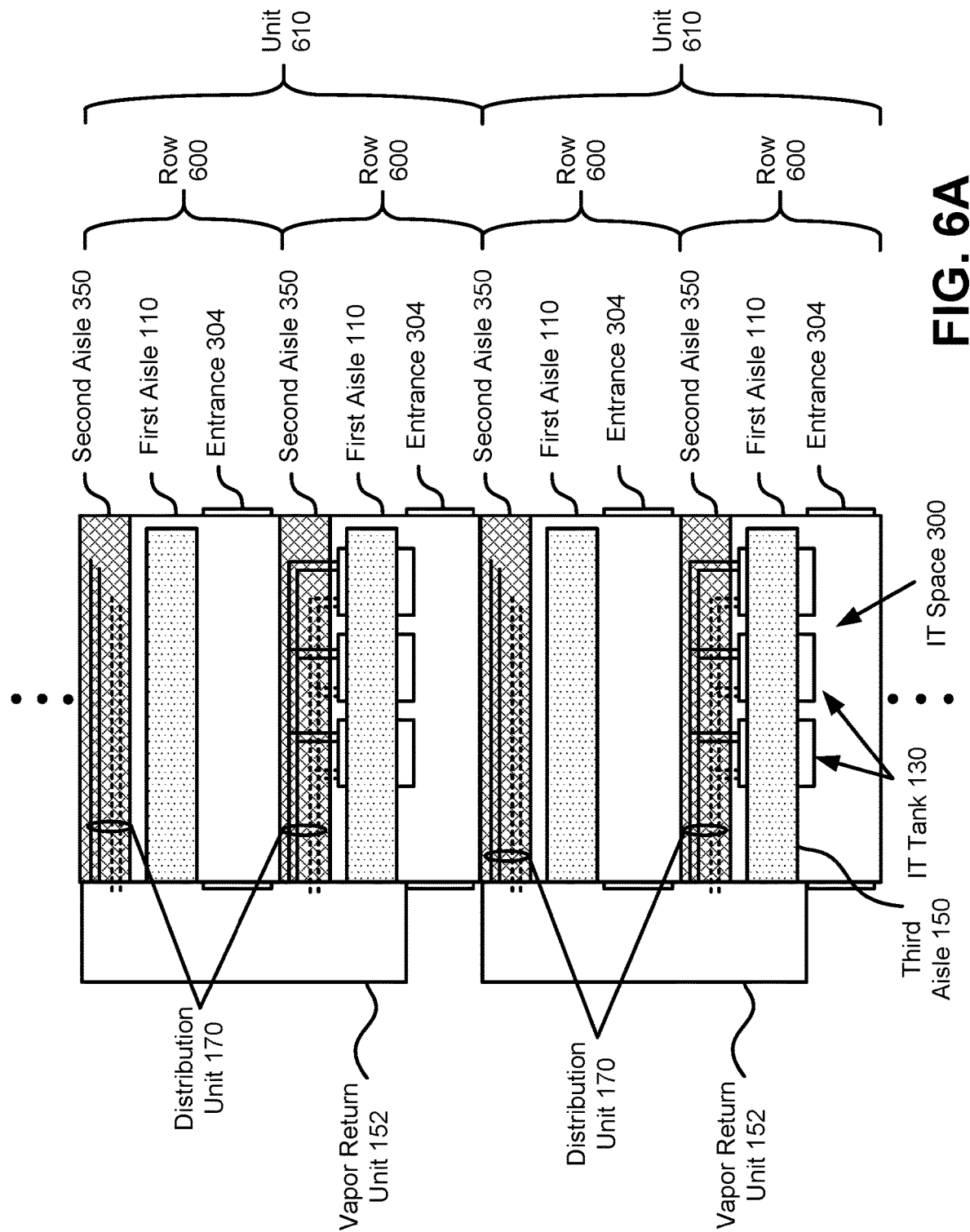
FIG. 6A is a top view diagram illustrating an arrangement of a cooling system according to one embodiment.
Figure 6B:
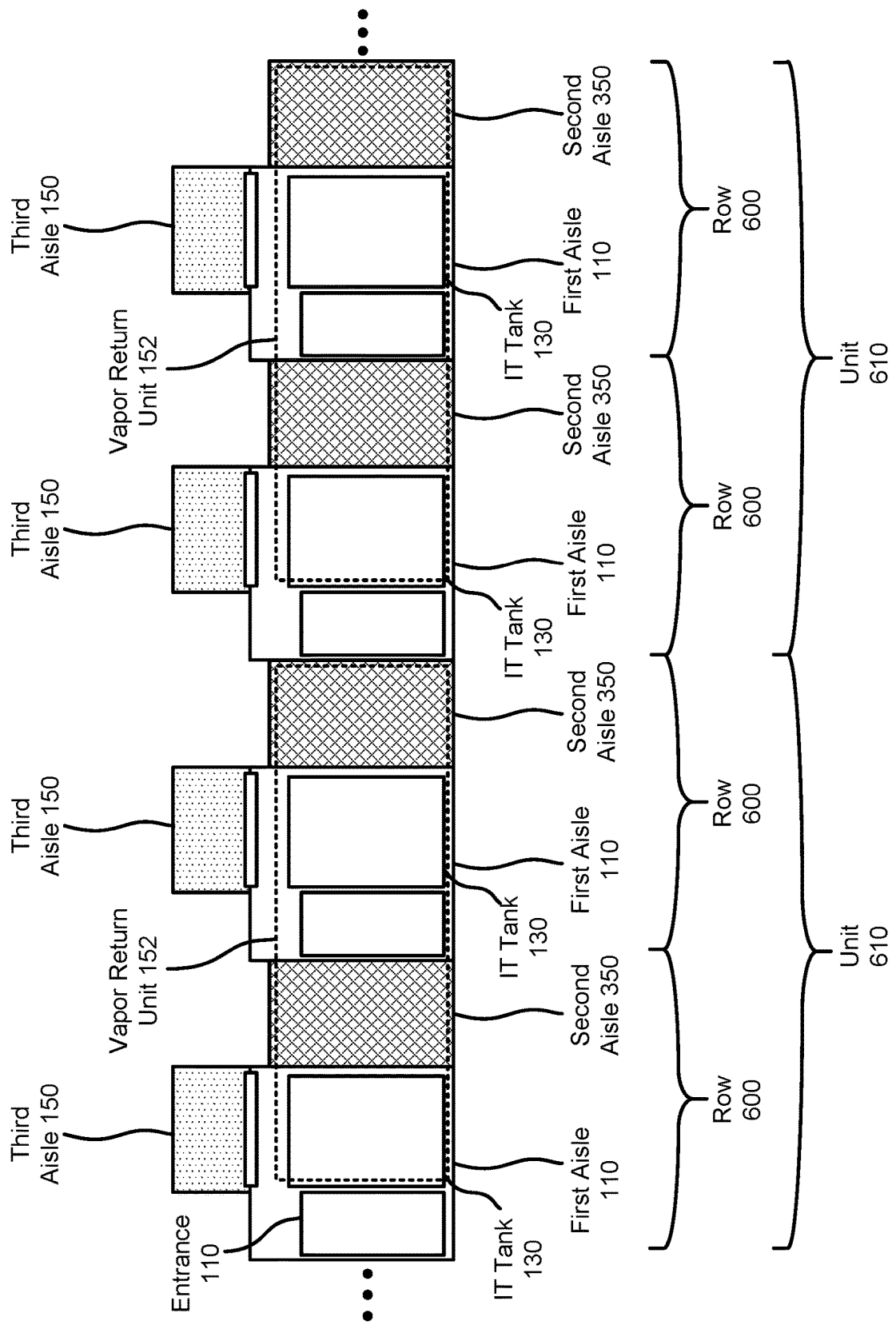
FIG. 6B is a side view diagram illustrating an arrangement of a cooling system according to one embodiment.

To form a cooling system, any number of each of the modules 500, 510, 520, 530, 540 may be moved into a room, such as a data center room, and connected to one another to form the cooling system. In such a system, groups of these modules may be considered to be a unit. For example, a unit may include two first modules, two second modules, two third modules, two fifth modules, and a fourth module that services the other modules. The cooling system may include any numbers of these units. The units may be arranged, for example, to repeat a pattern of the modules. Refer to FIGS. 6A and 6B for additional details regarding arrangements of modules, aisles, and/or other components of cooling system in accordance with one or more embodiments. The modular design may vary depending on the data center room layout since two sets of the combined first module and second module may share one set of the third, fourth, and the fifth modules.

Generally, a cooling system may be deployed by arranging multiple aisles, vapor return units, and distribution units. FIGS. 6A and 6B show diagrams of a cooling system arrangement in accordance with one or more embodiments.

Turning to FIG. 6A, a top view diagram of the arrangement of the cooling system is shown. The aisles 110, 150, 350 may be arranged as rows 600. Each row may include one of each of the aisles. A row may be duplicated repeatedly, as seen in the figure, to form the cooling system. This pattern may be duplicated any number of times to form the cooling system. The cooling system may include additional and different components from those shown in FIG. 6A without departing from embodiments disclosed herein.

A vapor return unit 152 may be dedicated to service two rows, as seen in the figure, to form a unit 610. Thus, a cooling system in accordance with one or more embodiments may include repeated units arranged with respect to one another (e.g., in a column such that the entrances to the various aisles are positioned on common sides and the vapor return units are also consistently positioned with respect the aisles). The cooling system may include a number of repetitions of unit 610 so as to scale the capacity of the cooling system to meet IT system needs.

Turning to FIG. 6B, an end view diagram of the arrangement of the cooling system is shown. As discussed above, the aisles 110, 150, 350 may be arranged as rows 600, and a corresponding vapor return unit 152 may service two rows to form a unit 610. As seen in this figure, each of third aisle 150 in a unit may be connected to the vapor return unit 152 in the unit so that vapor is returned to the vapor return unit 152 from both of the first aisles in the unit through the third aisles. The vapor return unit in the unit may also be connected to the distribution unit (e.g., positioned in the second aisles in the unit) so that the liquid coolant (e.g., condensed from the vapor) may be distributed to IT tanks in the first aisles of the unit.

While illustrated in FIGS. 6A and 6B with respect to a particular arrangement, various modifications to the arrangement, and the components thereof, to accommodate different deployments scales may be made so as to size the cooling system appropriately. Additionally, while the vapor return units are illustrated in these figures as being positioned on one end of the aisles, the vapor return units may be positioned at the other ends of the aisles or in different locations (or vapor return units may be positioned at both ends of the aisles). Further, while some details regarding distribution unit 170 have been illustrated, the various components, connections, and other features of the distribution unit 170 may be different from as illustrated herein to provide the fluid loops discussed throughout this disclosure.

In the foregoing specification, embodiments have been described with reference to specific exemplary example embodiments thereof. It will be evident that various modifications may be made thereto without departing from the broader spirit and scope of the embodiments as set forth in the following claims. The specification and drawings are, accordingly, to be regarded in an illustrative sense rather than a restrictive sense.

What is claimed is:

1. A cooling system, comprising:
  a first aisle comprising:
    an information technology (IT) space for storing immersion tanks,
    immersion tanks positioned in the IT space and adapted to house computing devices at least partially submerged in liquid coolant contained therein, and
    an access region that runs along a length of the first aisle and from which each of the immersion tanks can be physically accessed;
  a second aisle positioned next to the first aisle and through which the immersion tanks are moved into and out of the first aisle;
  a third aisle positioned above the first aisle to receive vapor from the first aisle;
  a vapor return unit adapted to condense the vapor received by the third aisle into the liquid coolant, wherein the vapor return unit comprises a condenser module for condensing the vapor that is outside of the immersion tanks into the liquid coolant; and
  a distribution unit adapted to distribute the liquid coolant to the immersion tanks, wherein a positioning pattern of the first aisle, the second aisle, and the third aisle is sequentially repeated with one or more additional first aisle, one or more additional second aisle, and one or more additional third aisle, and wherein the vapor return unit services the immersion tanks by condensing vapor from the third aisle and the one or more additional third aisle and returning the condensed vapor to the second aisle and the one or more additional second aisle.

2. The cooling system of claim 1, wherein the IT space is positioned only in the first aisle.

3. The cooling system of claim 2, wherein the first aisle is pneumatically connected to the third aisle with one or more holes forming a single opening or a partially perforated area above the IT space to allow the vapor to rise from the immersion tanks into the third aisle.

4. The cooling system of claim 3, wherein the vapor return unit is connected to the third aisle to receive the vapor from the third aisle.

5. The cooling system of claim 4, wherein the vapor return unit returns the liquid coolant to the distribution unit to resupply the immersion tanks.

6. The cooling system of claim 5, wherein a cooling fluid is circulated to the vapor return unit to condense the vapor into the liquid coolant.

7. The cooling system of claim 6, wherein each of the immersion tanks comprise a condenser for condensing vapor inside the respective immersion tanks into the liquid coolant using the cooling fluid.

8. The cooling system of claim 1, wherein a cooling fluid is delivered to the vapor return unit and then to the distribution unit through the vapor return unit.

9. The cooling system of claim 1, wherein the immersion tanks do not include condensers and allow for the vapor to rise out of the immersion tanks during normal operation, and the immersion tanks are deployed to the first aisle and normally operate in the first aisle.

10. A data center system, comprising:
  a set of computing devices;
  a first aisle comprising:
    an information technology (IT) space for storing immersion tanks,
    immersion tanks positioned in the IT space and in which the set of computing devices are housed at least partially submerged in liquid coolant are contained therein, and
    an access region that runs along a length of the first aisle and from which each of the immersion tanks can be physically accessed;

a second aisle positioned next to the first aisle and through which the immersion tanks are moved into and out of the first aisle;

a third aisle positioned above the first aisle to receive vapor from the first aisle;

a vapor return unit adapted to condense the vapor received by the third aisle into the liquid coolant; and a distribution unit adapted to distribute the liquid coolant and a cooling fluid to the immersion tanks, wherein the cooling fluid is delivered to the vapor return unit and then to the distribution unit through the vapor return unit.

11. The data center system of claim 10, wherein the IT space is positioned only in the first aisle and is accessible from the second aisle.

12. The data center system of claim 11, wherein the first aisle is pneumatically connected to the third aisle with one or more holes forming a single opening or partially perforated area above the IT space to allow the vapor to rise from the immersion tanks into the third aisle.

13. The data center system of claim 12, wherein the vapor return unit comprises a condenser module for condensing the vapor that is outside of the immersion tanks into the liquid coolant.

14. The data center of claim 10, wherein a positioning pattern of the first aisle, the second aisle, and the third aisle is sequentially repeated with one or more additional first aisle, one or more additional second aisle, and one or more additional third aisle, and wherein the vapor return unit services the immersion tanks by condensing vapor from the third aisle and the one or more additional third aisle and returning the condensed vapor to the second aisle and the one or more additional second aisle.

15. A modularized cooling system, comprising:

a first module comprising a first aisle, the first aisle comprising information technology (IT) space for storing immersion tanks, an access region that runs along a length of the first aisle and from which immersion tanks in the IT space can be physically accessed, and a first opening out of the first aisle and through which vapor from the immersion tanks may flow out of the first aisle;

a second module comprising a third aisle for management of the vapor, the third aisle comprising a second opening out of the third aisle to allow the vapor to flow into the third aisle;

a third module comprising a second aisle through which the immersion tanks are moved into and out of the first aisle;

a fourth module comprising a vapor return unit for condensing the vapor into liquid coolant used by the immersion tanks to cool devices contained therein; and a fifth module comprising a distribution unit for distributing liquid coolant to the immersion tanks.

16. The modularized cooling system of claim 15, wherein the first opening is on a top of the first aisle and the second opening is on a bottom of the third aisle so that the vapor rises out of the first aisle through the first opening and into the third aisle through the second opening while the second module is above the first module with the first opening positioned with the second opening.

17. The modularized cooling system of claim 15, wherein the fifth module is positioned inside of the third module.

18. The modularized cooling system of claim 15, wherein of the first module, the second module, the third module, the fourth module, and the fifth module are attachable to one another to form:

a loop through which a cooling fluid flows through condensers and does not undergo any state transitions while flowing through the loop, and a coolant management topology through which the coolant undergoes a liquid to gas state transition in the immersion tanks to form the vapor in the first module and the vapor undergoes a gas to liquid state transition in the fourth module.

19. The modularized cooling system of claim 15, wherein a positioning pattern of the first aisle, the second aisle, and the third aisle is sequentially repeated with one or more additional first aisle, one or more additional second aisle, and one or more additional third aisle, and wherein the vapor return unit services the immersion tanks by condensing vapor from the third aisle and the one or more additional third aisle and returning the condensed vapor to the second aisle and the one or more additional second aisle.

* * * * *